United States Patent
Jahnke et al.

(10) Patent No.: US 10,833,567 B2
(45) Date of Patent: Nov. 10, 2020

(54) MONITORING SYSTEM FOR GROUNDING APPARATUS

(71) Applicant: CUTSFORTH, INC., Cohasset, MN (US)

(72) Inventors: David A. Jahnke, La Conner, WA (US); Robert S. Cutsforth, Bellingham, WA (US); Dustin L. Cutsforth, Leawood, KS (US)

(73) Assignee: CUTSFORTH, INC., Cohasset, MN (US)

( * ) Notice: Subject to any disclaimer, the term of this patent is extended or adjusted under 35 U.S.C. 154(b) by 191 days.

(21) Appl. No.: 15/997,102

(22) Filed: Jun. 4, 2018

(65) Prior Publication Data

US 2018/0351439 A1 Dec. 6, 2018

Related U.S. Application Data

(60) Provisional application No. 62/515,108, filed on Jun. 5, 2017.

(51) Int. Cl.
*H02K 11/40* (2016.01)
*G01R 31/34* (2020.01)
(Continued)

(52) U.S. Cl.
CPC .............. *H02K 11/40* (2016.01); *G01R 19/25* (2013.01); *G01R 31/343* (2013.01);
(Continued)

(58) Field of Classification Search
CPC ............... G01R 31/281; H05K 1/0268; H05K 2201/0761; H05K 2201/10151
(Continued)

(56) References Cited

U.S. PATENT DOCUMENTS

| 3,831,160 A | 8/1974 | Cronin et al. |
| 4,163,227 A | 7/1979 | Sawada et al. |

(Continued)

FOREIGN PATENT DOCUMENTS

| CA | 2498105 A1 | 3/2004 |
| WO | 2017060218 A1 | 4/2017 |

OTHER PUBLICATIONS

Stone et al., "Monitoring of Shaft Voltages and Grounding Currents in Rotating Machines", 2014 17th International Conference on Electrical Machines and Systems (ICEMS), IEEE, pp. 3361-3364, Oct. 22, 2014.

(Continued)

*Primary Examiner* — Giovanni Astacio-Oquendo
(74) *Attorney, Agent, or Firm* — Seager, Tufte & Wickhem LLP

(57) ABSTRACT

A shaft grounding and monitoring system may include a grounding member slidingly engageable with a rotating shaft. An electrical sensor may be configured to be coupled with the grounding member in order to detect an electrical parameter that provides an indication of electricity flowing from the rotating shaft to ground through the grounding member. A processor may be operably coupled with the electrical sensor and may receive and analyze data from the electrical sensor at multiple sampling points taken at different rotational positions of the rotating shaft during multiple revolutions of the rotating shaft. The processor may be configured to develop, over time, a reconstructed waveform representing a compilation of the periodically sampled values of the data from the electrical sensor through one revolution of the rotating shaft.

23 Claims, 12 Drawing Sheets

(51) Int. Cl.
  *G01R 19/25* (2006.01)
  *G05B 23/02* (2006.01)
  *H02K 11/26* (2016.01)
  *H02K 5/173* (2006.01)

(52) U.S. Cl.
  CPC ......... *G05B 23/0235* (2013.01); *H02K 11/26* (2016.01); *H02K 5/1732* (2013.01)

(58) Field of Classification Search
  USPC .................................. 324/763.01, 537, 500
  See application file for complete search history.

(56) References Cited

U.S. PATENT DOCUMENTS

| | | | |
|---|---|---|---|
| 4,406,991 A * | 9/1983 | Strycula | H03H 7/01 333/175 |
| 4,426,641 A | 1/1984 | Kurihara | |
| 4,451,786 A | 5/1984 | Sawada et al. | |
| 4,831,295 A | 5/1989 | Posedel | |
| 4,873,512 A | 10/1989 | Miller | |
| 4,987,009 A * | 1/1991 | Nakamura | H01L 27/016 257/E27.116 |
| 5,006,769 A | 4/1991 | Posedel | |
| 5,198,713 A * | 3/1993 | Suzuta | B06B 1/0207 310/316.01 |
| 5,233,499 A | 8/1993 | Twerdochlib | |
| 5,297,721 A * | 3/1994 | Schneider | B23K 35/3616 148/23 |
| 5,461,329 A | 10/1995 | Linehan et al. | |
| 5,488,281 A | 1/1996 | Unsworth et al. | |
| 6,460,013 B1 | 10/2002 | Nippes | |
| 6,714,020 B2 | 3/2004 | Hobelsberger et al. | |
| 7,034,430 B2 | 4/2006 | Custforth et al. | |
| 7,034,706 B1 | 4/2006 | Nippes | |
| 7,102,379 B2 | 9/2006 | Hobelsberger et al. | |
| 7,117,744 B2 | 10/2006 | Hobelsberger et al. | |
| 7,212,010 B2 | 5/2007 | Hobelsberg | |
| 7,649,470 B2 | 1/2010 | Hobelsberger et al. | |
| 7,705,623 B2 | 4/2010 | Hobelsberger | |
| 7,830,031 B2 | 11/2010 | Helle et al. | |
| 8,396,677 B2 | 3/2013 | Hobelsberger et al. | |
| 8,493,707 B2 | 7/2013 | Cutsforth | |
| 8,714,860 B2 | 5/2014 | Cutsforth | |
| 9,046,579 B2 | 6/2015 | Gattermann et al. | |
| 9,088,197 B2 | 7/2015 | Nair | |
| 9,209,667 B2 | 12/2015 | Cutsforth | |
| 9,560,729 B2 | 1/2017 | Cutsforth et al. | |
| 2002/0101396 A1 * | 8/2002 | Huston | G09G 3/002 345/87 |
| 2005/0183504 A1 | 8/2005 | Hobelsberger et al. | |
| 2005/0184751 A1 | 8/2005 | Hobelsberger et al. | |
| 2005/0200378 A1 | 9/2005 | Hobelsberger et al. | |
| 2006/0043977 A1 | 3/2006 | Hobelsberger | |
| 2008/0163893 A1 * | 7/2008 | Quillen | C11D 3/2017 134/2 |
| 2009/0008945 A1 | 1/2009 | Helle et al. | |
| 2009/0179663 A1 | 7/2009 | Hobelsberger | |
| 2010/0299090 A1 | 11/2010 | Hobelsberger et al. | |
| 2011/0301873 A1 | 12/2011 | Cocconcelli | |
| 2013/0032373 A1 | 2/2013 | Cutsforth | |
| 2013/0034380 A1 | 2/2013 | Cutsforth | |
| 2015/0070810 A1 | 3/2015 | Cutsforth et al. | |
| 2016/0266206 A1 | 9/2016 | Thompson et al. | |
| 2017/0285086 A1 | 10/2017 | Thompson | |
| 2018/0026498 A1 | 1/2018 | Thompson | |

OTHER PUBLICATIONS

International Search Report and Written Opinion dated Oct. 8, 2018 for International Application No. PCT/US2018/035829.

* cited by examiner

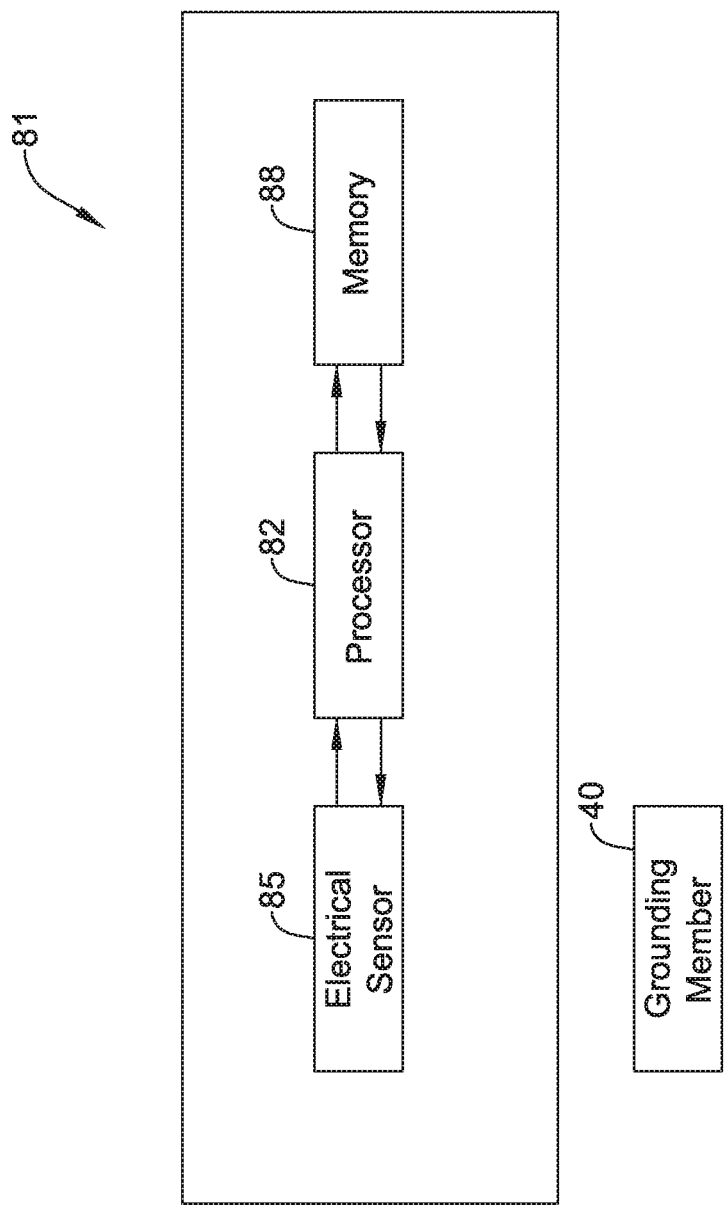

MONITORING SYSTEM FOR GROUNDING APPARATUS

RELATED APPLICATIONS

This application claims the benefit of U.S. Provisional Patent Application Ser. No. 62/515,108 entitled "MONITORING SYSTEM FOR GROUNDING APPARATUS" and filed Jun. 5, 2017, which application is hereby incorporated by reference in its entirety.

TECHNICAL FILED

The disclosure generally relates to monitoring systems for monitoring one or more components of a device having a rotating shaft susceptible to having a stray electrical voltage on the shaft. More specifically, the disclosure relates to monitoring apparatus, assemblies, systems and methods of monitoring one or more components, such as a grounding apparatus, of a device having a rotating shaft having a stray electrical voltage on the shaft.

BACKGROUND

In many devices that include a rotating shaft, such as but not limited to electric generators, electric motors, gear boxes such as windmill gear boxes, compressors, pumps, and the like, stray voltage may build up on the rotating shaft. Apart from any stray voltages resulting from equipment that is not functioning correctly, all rotating shafts inherently generate electric fields from asymmetries in magnetic field distribution between rotor and stator, residual magnetic flux in the shaft, excitation and electrostatic charges. These stray voltages may ultimately exit the rotating shaft through structures such as the bearings supporting the rotating shaft. Over time, this can damage the bearings and/or other components of the device.

In order to prevent current flow through structures like bearings and related components, a grounding apparatus may be used to ground the rotating shaft. Such grounding apparatus may include grounding brushes, grounding straps, grounding ropes and other grounding members configured to ground the rotating shaft of the device. In maritime applications, propulsion shafts may include a grounding apparatus in order to avoid galvanic activity that can otherwise cause erosion. There is a desire to monitor the performance of the grounding apparatus to ensure that the grounding apparatus is performing correctly. There is also a desire to monitor electrical current flowing through the grounding apparatus in order to detect and diagnose potential defects or other problems within the device.

SUMMARY

The disclosure is directed to several alternate designs, materials and methods of monitoring the performance of a grounding apparatus for an electric generator, an electric motor, a gearbox, a compressor, a pump, a drive shaft, an axle, or other device including a rotating shaft subject to stray electrical voltage on the shaft.

Accordingly, an illustrative embodiment of the disclosure is a shaft grounding and monitoring system for a device having a rotating shaft. The shaft grounding and monitoring system includes a grounding member configured to make sliding electrical contact with the rotating shaft and configured to be connected to ground. An electrical sensor is configured to sense an electrical parameter that provides an indication of electricity flowing through the grounding member. A processor is operably coupled with the electrical sensor and is configured to receive and analyze data from the electrical sensor representing the electrical parameter. A memory is operably coupled with the processor and is configured to store data processed by the processor that is representative of the data provided by the electrical sensor. The processor is further configured to periodically sample a value of the electrical parameter from the electrical sensor and record the value to the memory and to develop, over time, a reconstructed waveform representing a compilation of the periodically sampled values of the electrical parameter from the electrical sensor.

Additionally or alternatively to any above embodiment, the processor is further configured to sample the value of the electrical parameter from the electrical sensor and record the value to the memory in response to a periodic trigger.

Additionally or alternatively to any above embodiment, the periodic trigger is based upon a rotational speed of the rotating shaft.

Additionally or alternatively to any above embodiment, the periodic trigger is based upon a rotational position of the rotating shaft.

Additionally or alternatively to any above embodiment, the periodic trigger includes an incremental delay so that each successive sampling of an instantaneous value of the electrical parameter from the electrical sensor includes a different portion of a successive waveform.

Additionally or alternatively to any above embodiment, the value of the electrical parameter from the electrical sensor includes an amplitude of a waveform representing the electrical parameter from the electrical sensor.

Additionally or alternatively to any above embodiment, the electrical sensor includes an electrical current sensor or an electrical voltage sensor.

Additionally or alternatively to any above embodiment, the processor is further configured to correlate the reconstructed waveform to relative positions of the rotating shaft in order to determine where on the rotating shaft any anomalous or threshold conditions may be occurring.

Additionally or alternatively to any above embodiment, the processor is further configured to utilize an indication of shaft rotational speed and a known sampling rate to correlate the reconstructed waveform to relative positions of the rotating shaft.

Additionally or alternatively to any above embodiment, the processor is further configured to, when periodically sampling a value of the electrical parameter from the electrical sensor and recording the value to the memory, to also record to the memory a corresponding shaft rotational position that is temporally aligned with the value of the electrical parameter from the electrical sensor, and the processor is further configured to use the temporally aligned recorded shaft rotational positions to correlate the reconstructed waveform to relative positions of the rotating shaft.

Additionally or alternatively to any above embodiment, the processor is further configured to analyze the reconstructed waveform to look for anomalous or threshold conditions that may be occurring.

Another illustrative embodiment of the disclosure is a monitoring system for a device having a rotating shaft and a grounding member positioned in electrical contact with the rotating shaft. The monitoring system includes a voltage sensor configured to sense an electrical voltage in the rotating shaft and a processor that is operably coupled with the voltage sensor and is configured to receive and analyze data indicative of electrical voltage sensed by the voltage sensor. A memory is operably coupled with the processor and is configured to store data processed by the processor that is indicative of the data provided by the voltage sensor. The processor is further configured to periodically sample a value of the data indicative of electrical voltage from the voltage sensor and record the value to the memory and to develop, over time, a reconstructed waveform representing a compilation of the periodically sampled values of the data indicative of electrical voltage from the voltage sensor.

Additionally or alternatively to any above embodiment, the processor is further configured to sample the value of the data indicative of electrical voltage from the voltage sensor and record the value to the memory in response to a periodic trigger.

Additionally or alternatively to any above embodiment, the periodic trigger is based upon a rotational speed and/or angular position of the rotating shaft.

Additionally or alternatively to any above embodiment, the periodic trigger includes an incremental delay so that each successive sampling of a value of the data indicative of electrical voltage from the voltage sensor includes a different portion of a successive waveform.

Additionally or alternatively to any above embodiment, the value of the data indicative of electrical voltage from the voltage sensor includes an amplitude of a waveform representing data indicative of electrical voltage from the voltage sensor.

Additionally or alternatively to any above embodiment, the processor is further configured to analyze the reconstructed waveform to look for anomalous or threshold conditions that may be occurring.

Another illustrative embodiment of the disclosure is a monitoring system for a device having a rotating shaft and a grounding member positioned in electrical contact with the rotating shaft. The monitoring system includes an electrical sensor that is configured to sense an electrical parameter in the rotating shaft and a processor that is operably coupled with the voltage sensor and is configured to receive and analyze data indicative of the electrical parameter sensed by the electrical sensor. A memory is operably coupled with the processor and is configured to store data processed by the processor that is indicative of the data provided by the electrical sensor. The processor is further configured to periodically sample a value of the data indicative of the electrical parameter from the electrical sensor at a sampling rate that is related to a rotation speed of the rotating shaft such that a particular sampling corresponds to an angular position of the rotating shaft that is rotationally offset from the angular position of the rotating shaft corresponding to an immediately previous sampling, the processor recording each value to the memory. The processor is further configured to develop, over time, a reconstructed waveform representing a compilation of the periodically sampled values of the data indicative of electrical voltage from the electrical sensor.

Additionally or alternatively to any above embodiment, the sampling rate is related to the rotation speed of the rotating shaft such that a particular sampling corresponds to an angular position of the rotating shaft that is rotationally advanced of the angular position of the rotating shaft corresponding to an immediately previous sampling.

Additionally or alternatively to any above embodiment, the sampling rate is related to the rotation speed of the rotating shaft such that a particular sampling corresponds to an angular position of the rotating shaft that is rotationally retarded of the angular position of the rotating shaft corresponding to an immediately previous sampling.

Additionally or alternatively to any above embodiment, the electrical sensor includes a voltage sensor.

Additionally or alternatively to any above embodiment, the value of the data indicative of the electrical parameter includes an amplitude of a waveform representing data indicative of electrical voltage from the voltage sensor.

Additionally or alternatively to any above embodiment, the processor is further configured to analyze the reconstructed waveform to look for anomalous or threshold conditions that may be occurring.

The above summary of some embodiments is not intended to describe each disclosed embodiment or every implementation of the present disclosure. The Figures, and Detailed Description, which follow, more particularly exemplify some of these embodiments.

BRIEF DESCRIPTION OF THE DRAWINGS

The invention may be more completely understood in consideration of the following detailed description of various embodiments in connection with the accompanying drawings, in which:

FIG. 6 is a schematic view of a monitoring system for a rotating shaft;

Figure 1:
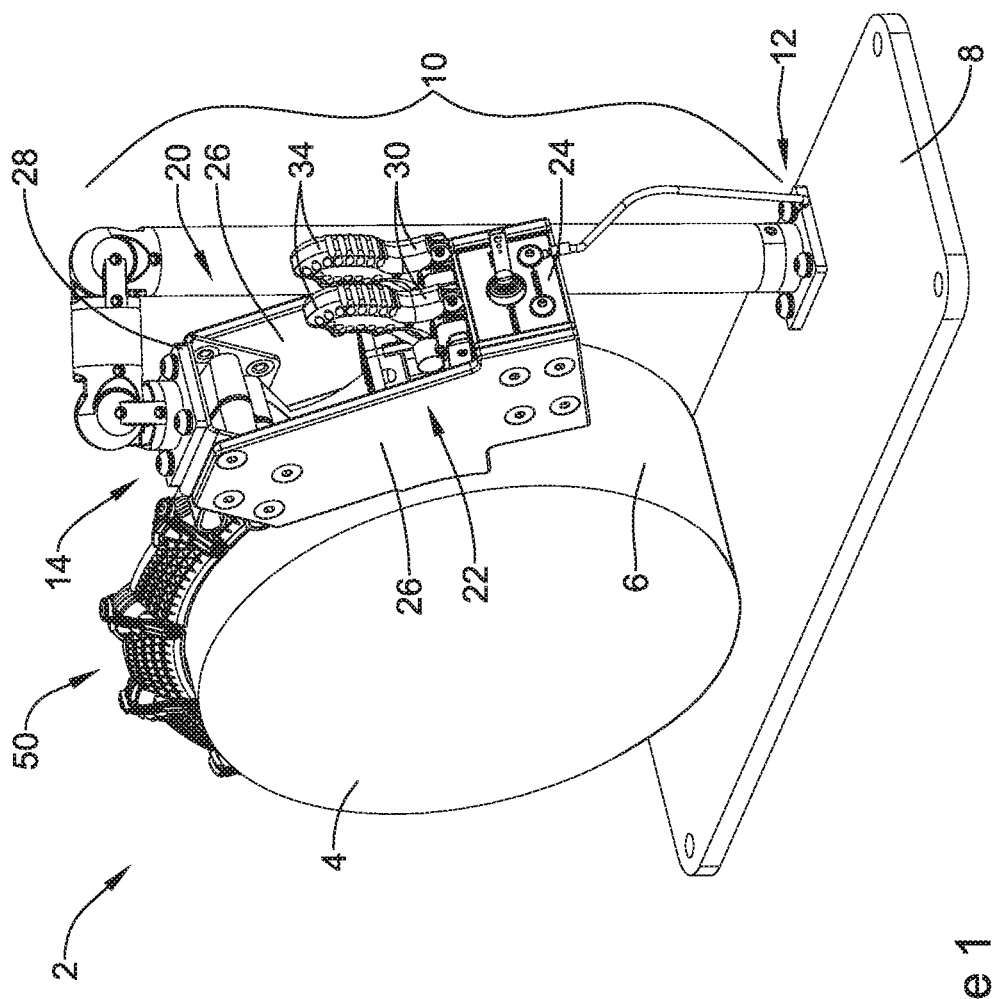
FIG. 1 is a perspective view of a portion of a rotating mechanism of an electric machine having a shaft grounding apparatus positioned on the shaft.

While the invention is amenable to various modifications and alternative forms, specifics thereof have been shown by way of example in the drawings and will be described in detail. It should be understood, however, that the intention is not to limit aspects of the invention to the particular embodiments described. On the contrary, the intention is to cover all modifications, equivalents, and alternatives falling within the spirit and scope of the invention.

DETAILED DESCRIPTION

For the following defined terms, these definitions shall be applied, unless a different definition is given in the claims or elsewhere in this specification.

All numeric values are herein assumed to be modified by the term "about," whether or not explicitly indicated. The term "about" generally refers to a range of numbers that one of skill in the art would consider equivalent to the recited value (i.e., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include one or more particular features, structures, and/or characteristics. However, such recitations do not necessarily mean that all embodiments include the particular features, structures, and/or characteristics. Additionally, when particular features, structures, and/or characteristics are described in connection with one embodiment, it should be understood that such features, structures, and/or characteristics may also be used connection with other embodiments whether or not explicitly described unless clearly stated to the contrary.

The following detailed description should be read with reference to the drawings in which similar structures in different drawings are numbered the same. The drawings, which are not necessarily to scale, depict illustrative embodiments and are not intended to limit the scope of the disclosure.

A variety of devices include a rotating shaft that makes contact with a stationary or largely stationary electrical conductor. Examples include but are not limited to electric machines such as dynamo-electric machines including electrical generators and electrical motors. For illustrative purposes, the disclosure will make reference to an electrical machine (e.g., an electrical generator), but it will be appreciated that the concepts discussed herein are equally applicable to other equipment as well. Additional examples of devices having a rotating shaft include gearboxes, such as a windmill gearbox, pumps, compressors, drive shafts, axles, and the like. Maritime propulsion systems also utilize a rotating shaft. FIGS. 1 through 5 provide illustrative views of an electric machine 2 that may incorporate a shaft grounding and monitoring system. In some instances, a monitoring system that is configured to monitor the performance of a shaft grounding system, and thus monitor the health of the electric machine 2, may be built into a shaft grounding system such as that described herein. In some cases, a monitoring system may, for example, be an add-on or retro-fit system that may be added to an existing shaft grounding apparatus or may be included with a shaft grounding apparatus installed on the electric machine 2. In other instances, the shaft monitoring system may be utilized independent of any shaft grounding apparatus.

FIG. 1 illustrates a portion of an electric machine 2 having a rotating mechanism, such as a rotating shaft 4. The electric machine 2 may be a dynamo-electric machine, such as an electric generator which converts mechanical energy into electrical energy, or an electric motor which converts electrical energy into mechanical energy. Accordingly, the rotating shaft 4 may be connected to, but electrically isolated from, a collector ring, or similar structure, of an electric generator or a commutator, or similar structure of an electric motor adapted and configured to interact with or be a part of a sliding connection to complete an electrical circuit between a fixed and a moving conductor to pass electrical current therebetween. For example, in at least some generators or motors, the collector rings or commutators are adapted and configured to complete a circuit with brush assemblies or riggings within the generator or motor. The rotating shaft 4 may transfer mechanical energy from a power source to the collector ring of an electrical generator and/or transfer mechanical energy from a commutator of an electric motor. Those of skill in the art will recognize that the size and configuration of the rotating shaft 4 may vary, depending on the type and/or size of the generator or motor in which the rotating shaft 4 is used. For example, in some industrial applications, the rotating shaft 4 may have a diameter of 10 inches or more, 12 inches or more, 14 inches or more, 16 inches or more, 18 inches or more, 20 inches or more, 22 inches or more, or 24 inches or more. In other applications, the rotating shaft 4 may have a diameter of 10 inches or less, 8 inches or less, or 6 inches or less.

The rotating shaft 4, a portion of which is illustrated in FIG. 1, may be an elongate cylindrical shaft having an electrically conductive outer peripheral surface 6 configured to be in sliding electrical contact with a grounding apparatus. Although made of conductive metal, electricity is not intended to pass through the rotating shaft 4 and stray electrical voltages in the rotating shaft 4 may damage components of the electrical device, such as bearings, etc., particularly as these stray voltages attempt to pass through these components. In some instances, a shaft grounding apparatus 20 may be positioned proximate the rotating shaft 4 to ground the rotating shaft 4. One such shaft grounding apparatus 20 is further described in and relates to the subject matter contained in U.S. Pat. No. 8,493,707 entitled GROUNDING ROPE GUIDE FOR A DYNAMO-ELECTRIC MACHINE filed on Aug. 5, 2011, which is expressly incorporated herein by reference in its entirety.

A mounting fixture 10 may be used to position the shaft grounding apparatus 20 in close proximity to the rotating shaft 4. In some instances, the mounting fixture 10 may include a first end 12 mounted to a base 8, or other stationary structure, and a second end 14 mounted to the shaft grounding apparatus 20. One such mounting fixture 10, is further described in and relates to the subject matter contained in the U.S. patent application Ser. No. 13/204,176 entitled MOUNTING FIXTURE INCLUDING AN ARTICULATION JOINT filed on Aug. 5, 2011 and published as U.S. Patent App. No. 2013/0034380, which is expressly incorporated herein by reference in its entirety. However, it is understood that the mounting fixture 10 may be of any desired configuration to position the shaft grounding apparatus 20 in close proximity to the rotating shaft 4.

The shaft grounding apparatus 20 may include an electrical box 22 housing components of the shaft grounding apparatus 20. For example, the electrical box 22 may include one or more, or a plurality of brush holders 30 including brushes 32 in electrical contact with the electrically conductive peripheral surface 6 of the rotating shaft 4. The brush holders 30 may also include a handle 34 for removing the brush holder 30 from the electrical box 22. In some instances, the brush holders 30 may be similar to those described in U.S. Pat. No. 7,034,430. The electrical box 22 may also include a control box 24 for controlling the flow of electricity from the electrical box 22.

The shaft grounding apparatus 20 may also include a rope guide 50 extending from the electrical box 22. For example, the electrical box 22 may include first and second side panels 26 secured (e.g., bolted) to a mount 28 of the mounting fixture 10 and to the rope guide 50.

Figure 2:
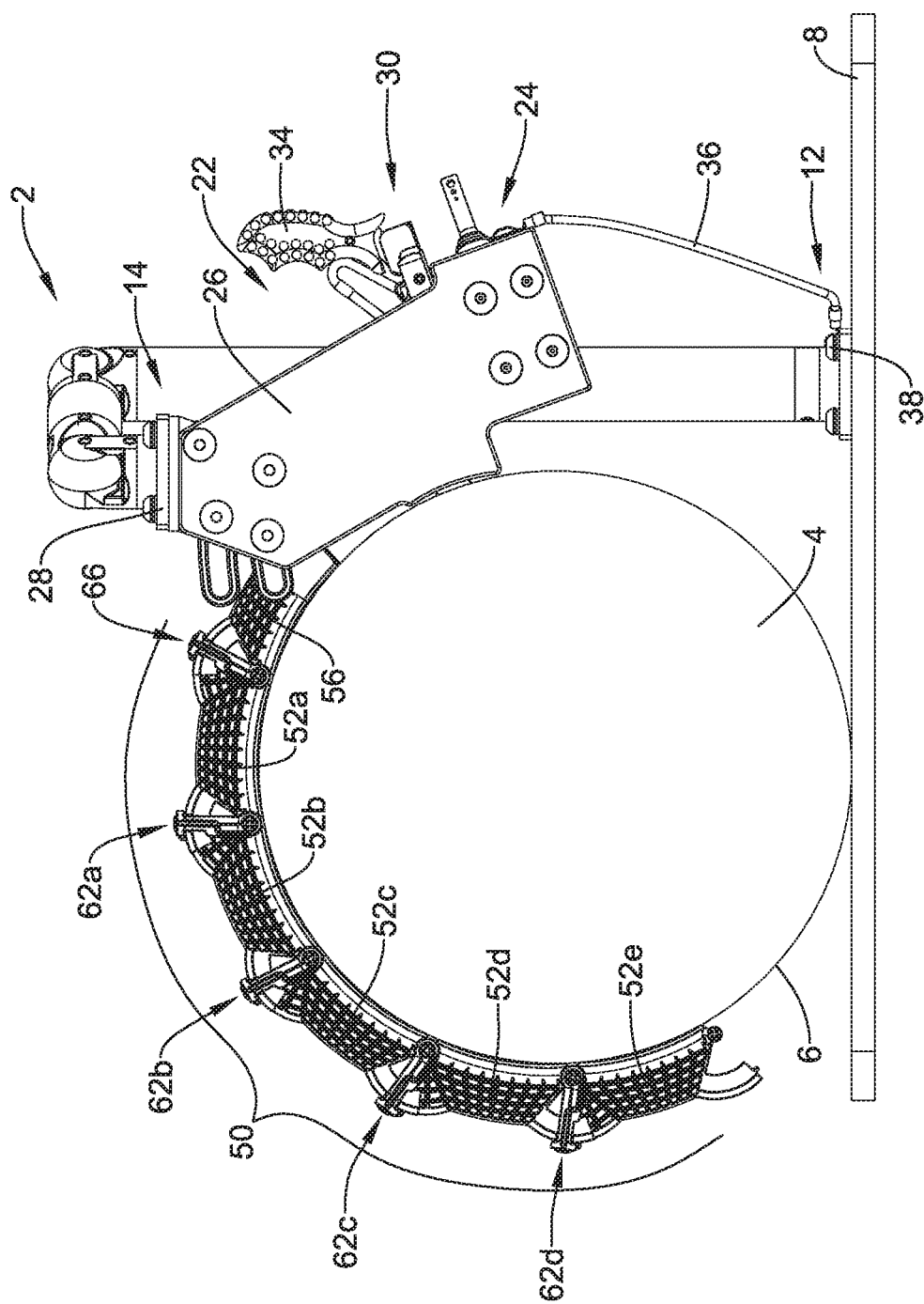
FIG. 2 is a side view of the shaft grounding apparatus of FIG. 1 positioned around the shaft of an electric machine.
Figure 3:
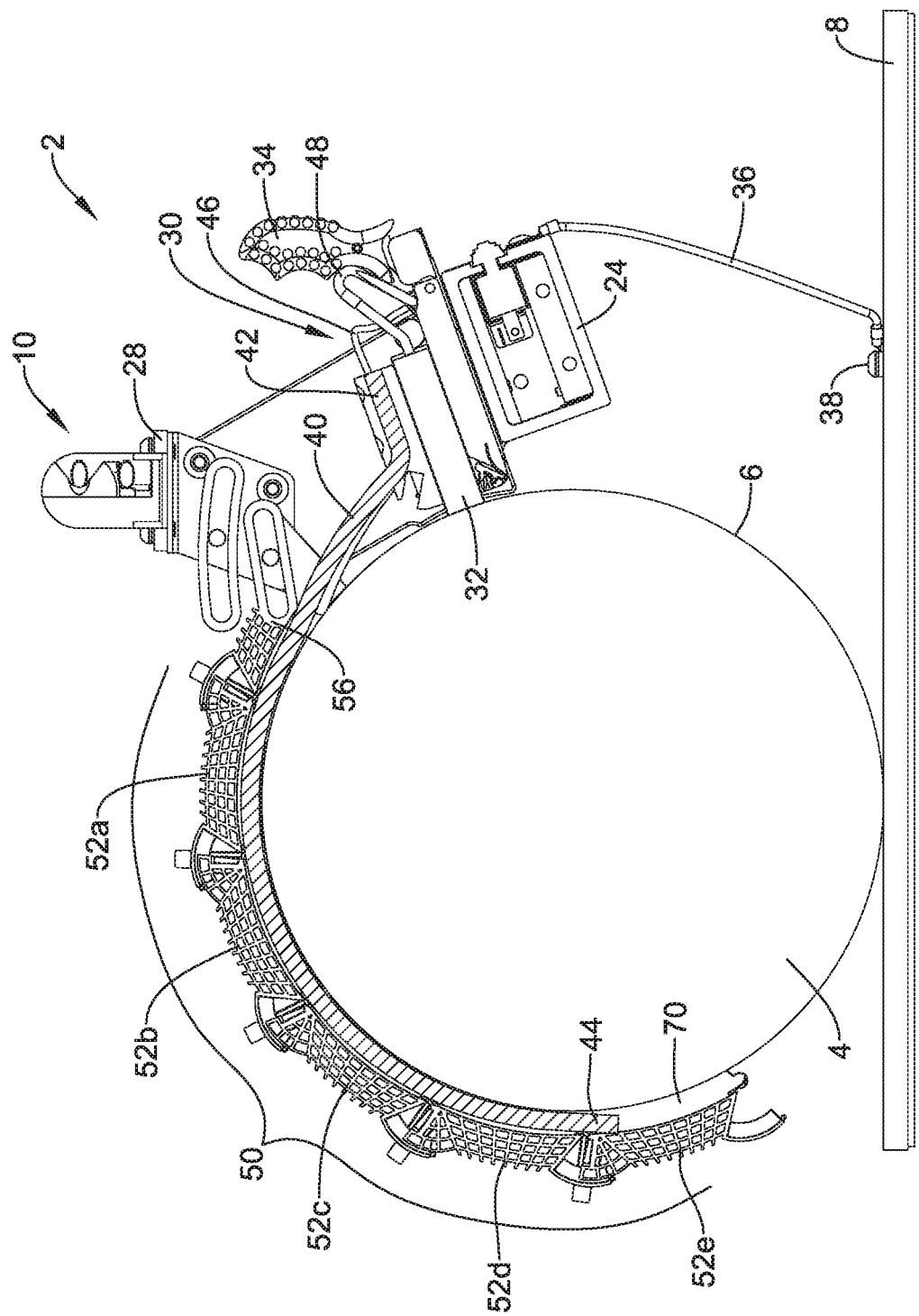
FIG. 3 is a cross-sectional view of the shaft grounding apparatus of FIG. 1 positioned around the shaft of an electric machine.

Turning to FIGS. 2 and 3, the rope guide 50 may be an adjustable rope guide configured to guide a grounding member, such as a grounding rope 40 on the electrically conductive surface 6 of the rotating shaft 4. For instance, the adjustable rope guide 50 may be adjustable between a first position having a first radius of curvature and a second position having a second radius of curvature greater than the first radius of curvature to provide the adjustable rope guide 50 with a variable radius of curvature to closely follow a radius of curvature of the rotating shaft 4. In some embodiments, the adjustable rope guide 50 may include a connector segment 56 and a plurality of articulating segments 52 configured to provide the adjustable rope guide 50 with a variable radius of curvature to closely follow a radius of curvature of the rotating shaft 4. In some embodiments, the connector segment 56 and/or the articulating segments 52 may be formed of a polymeric material, such as injection molded of a polymeric material, making the components of the rope guide 50 electrically insulated.

Depending on the diameter of the rotating shaft 4, and thus the length of the grounding rope 40, the rope guide 50 may include one, two, three, four, five, six or more articulating segments 52 pivotably coupled together at hinge points 62. For example, the illustrated rope guide 50 includes a first articulating segment 52a, a second articulating segment 52b, a third articulating segment 52c, a fourth articulating segment 52d, and a fifth articulating segment 52e, with a first hinge point 62a between the first and second articulating segments 52a, 52b, a second hinge point 62b between the second and third articulating segments 52b, 52c, a third hinge point 62c between the third and fourth articulating segments 52c, 52d, and a fourth hinge point 62d between the fourth and fifth articulating segments 52d, 52e. The first articulating segment 52a may also be pivotably coupled to the connector segment 56 at a hinge point 66. One such adjustable grounding rope guide is further described in and relates to the subject matter contained in the U.S. Pat. No. 8,493,707 entitled GROUNDING ROPE GUIDE FOR A DYNAMO-ELECTRIC MACHINE filed on Aug. 5, 2011, which is expressly incorporated by reference herein in its entirety.

The electrical pathway for grounding the rotating shaft 4 may be further understood with reference to FIG. 3. The electrical pathway may include a grounding member, such as the grounding rope 40, formed of a conductive material, such as copper or a copper alloy. The grounding rope 40, which extends through a channel 70 of the rope guide 50, may be positioned against the conductive surface 6 of the rotating shaft 4 such that the rotating shaft 4 slides against the grounding rope 40 as the rotating shaft 4 is rotating. The grounding rope 40 may be formed of a plurality of twisted multi-filar strands of conductive material, such as copper, or a copper alloy wires. It will be appreciated that the twisted multi-filar strands may provide a self-cleaning functionality as the rotating shaft 4 slides relative to the grounding rope 40. In other instances, the grounding rope 40 may have a different configuration. As used herein, the term "grounding rope" includes alternative configurations of a conductive grounding member such as a cable, wire, braid, band, strap or other elongate electrically conductive structure.

The grounding rope 40 may include a first end 42 coupled to a component in the electrical box 22 and a second end 44 hanging over the rotating shaft 4 in the direction of rotation of the rotating shaft 4. In some instances, the grounding rope 40 may have a length such that about 1 to 2 inches of the grounding rope 40 extends along the tangent line beyond the tangent between the conductive surface 6 and the grounding rope 40.

In some embodiments, the first end 42 of the grounding rope 40 may be secured to a rope holder 30 in the electrical box 22. For example, the first end 42 of the grounding rope 40 may be clamped between two plates of the rope holder 30 in some instances. From the terminal of the rope holder 30, the electrical pathway may pass through the control box 24 to a grounding wire 36 to ground 38. Thus, the grounding rope 40 may be connected to ground 38 through the electrical pathway passing through the electrical box 22, and thus grounded. In other embodiments, the first end 42 of the grounding rope 40 may be attached directly to ground 38 (e.g., a grounding post), or another component electrically coupled to ground 38, without being attached to the rope holder 30.

Figure 4:
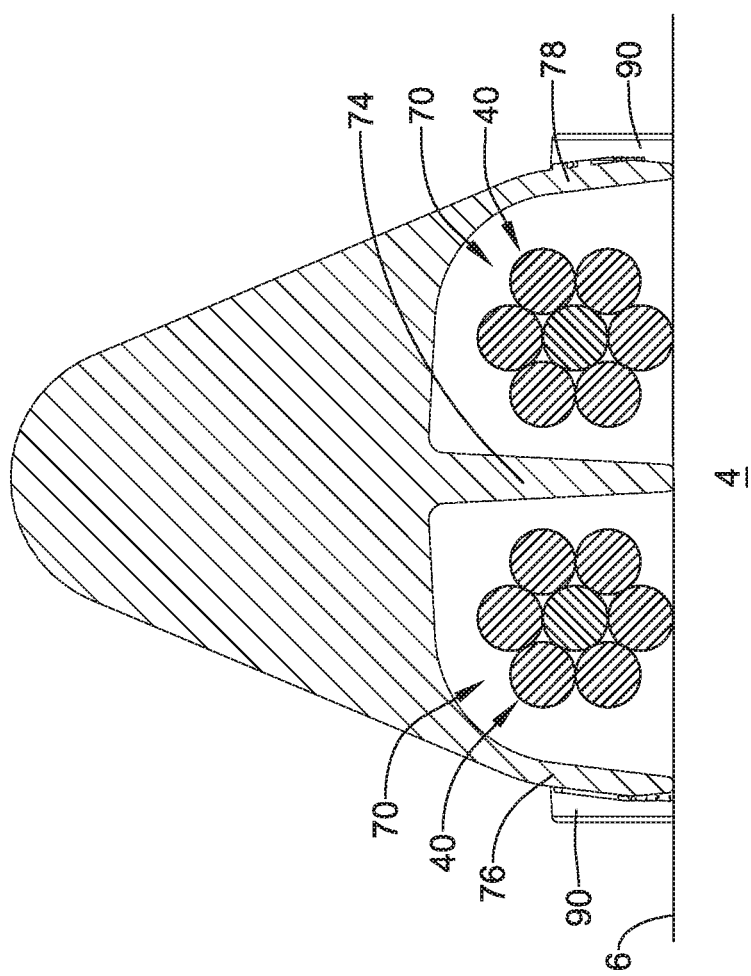
FIG. 4 is a cross-sectional view of the adjustable rope guide and grounding rope of FIG. 2.

FIG. 4 illustrates channels 70 provided in the rope guide 50 configured to receive the grounding ropes 40 for positioning along the conductive surface 6 of the rotating shaft 4. As can be seen from the figures, a first channel 70 may be defined between a first side wall 76 on the first side of the guide segment 52 and a divider wall 74, and a second channel 70 may be defined between a second side wall 76 on the second side of the guide segment 52 and the divider wall 74. The channels 70 may extend parallel to one another to position the grounding ropes 40 around a portion of the circumference of the rotating shaft 4. Thus, the channels 70 may open out to the bottom of the guide segments 52 facing the conductive surface 6 of the rotating shaft 4.

The shaft grounding apparatus 20 may be mounted proximate to the rotating shaft 4 to electrically ground the shaft 4 of the electric machine 2. For example, the grounding rope 40 may be placed in contact with the circumferential surface 6 of the rotating shaft 4. For instance, the grounding rope 40 may be draped over the rotating shaft 4 with the free second end 44 of the grounding rope 40 extending in the direction of rotation of the rotating shaft 4. It is noted that in some instances, multiple grounding ropes 40 (depending on the number of channels 70 provided in the rope guide 50) may be draped over the rotating shaft 4 to position the ropes 40 in contact with the surface 6 of the rotating shaft 4.

The adjustable rope guide 50 may also be positioned around a portion of the circumferential surface 6 of the rotating shaft 4 with the rope 40 extending along the channel 70 of the rope guide 50. In instances in which the rope guide 50 includes multiple channels 70, a rope 40 may be positioned in and extend along each channel 70 of the rope guide 50.

In order to accommodate the radius of curvature of the rotating shaft 4 such that the radius of curvature of the articulating segments 52 of the rope guide 50 closely matches the radius of curvature of the rotating shaft 4 and the lower edges of the articulating segments are positioned proximate the surface 6 of the rotating shaft 4, adjacent articulating segments 52 of the rope guide 50 may be pivoted relative to each other to adjust the radius of curvature of the adjustable rope guide 50. Thus, the rope(s) 40 may be circumferentially and/or axially constrained in the channel(s) 70 of the rope guide 50 along a portion of the circumference of the rotating shaft 4.

In some instances, the connector segment 56 and the articulating segments 52 of the rope guide 50 may be adjusted from a first minimum extent having a radius of curvature of 10 inches or less, 8 inches or less, or 6 inches or less to accommodate a similarly sized rotating shaft 4 to a second maximum extent having a radius of curvature of 10 inches or more, 12 inches or more, 14 inches or more, 16 inches or more, 18 inches or more, or 20 inches or more to accommodate a similarly sized rotating shaft 4. In some instances, the articulating segments 52 may be adjusted to extend substantially flat, thus accommodating rotating shafts 4 having an infinitely large diameter. Accordingly, through the adjustability of the rope guide 50, the rope guide 50 may be mounted to a range of sizes of rotating shafts 4, such as shafts 4 having diameters in the range of 6 to 36 inches, in the range of 6 to 24 inches, in the range of 6 to 20 inches, in the range of 6 to 18 inches, in the range of 6 to 16 inches, in the range of 6 to 14 inches, or in the range of 6 to 12 inches, in some instances.

Once the rope guide 50 has been adjusted to the desired radius of curvature to accommodate the diameter of the rotating shaft 4, the hinge points 62, 66 may be clamped to prevent further pivotable movement between adjacent guide segments 52, and between the connector segment 56 and the first guide segment 52*a*. Additional features of the rope guide 50, as well as the grounding rope 40, may be found in U.S. Patent Publication No. 2015/0070810 entitled GROUNDING ROPE FOR A SHAFT GROUNDING APPARATUS OF A DYNAMO-ELECTRIC MACHINE, filed on Sep. 9, 2014 and incorporated herein by reference in its entirety.

Accordingly, the rope guide 50 may guide the grounding rope(s) 40 along the rotating surface 6 of the rotating shaft 4. The grounding rope(s) 40 may be electrically grounded (e.g., connected to ground) to draw stray electrical voltage off of the rotating shaft 4 to prevent electrical current flow through bearings and/or other components of the electric machine 2 which could adversely affect the electric machine 2.

Figure 5:
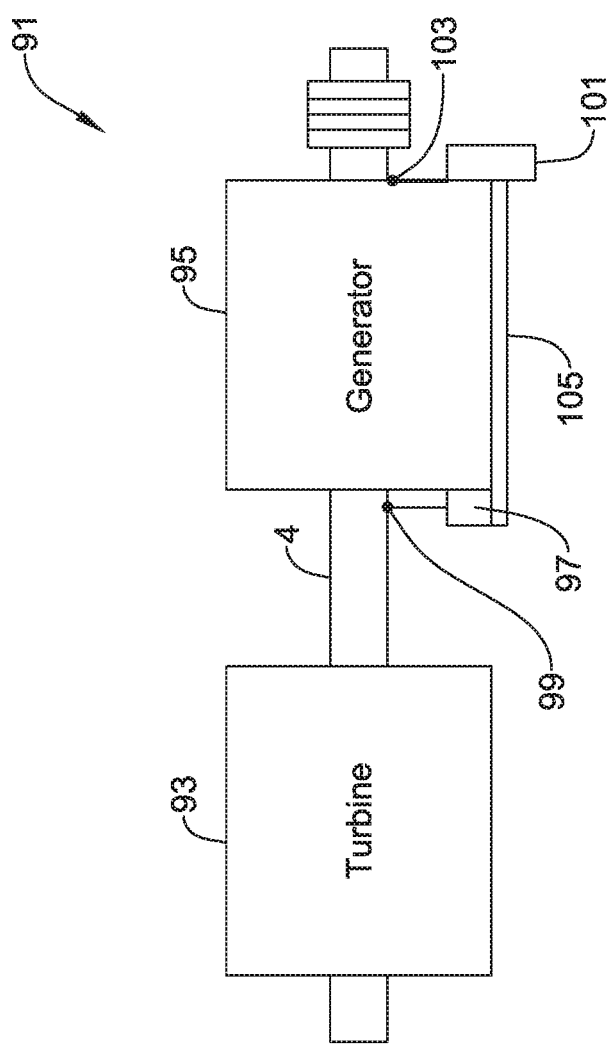
FIG. 5 is a schematic illustration of an electric generator incorporating at grounding monitoring system.

FIG. 5 is a schematic view of an electric generator 91 that may be considered as being representative of the electric machine 2. The electric generator 91 includes a turbine 93 and a generator 95. The rotating shaft 4 extends between the turbine 93 and the generator 95, and rotates therewith to transfer rotational energy between the turbine 93 and the generator 95. A signal acquisition assembly 97 is operably coupled with a shaft grounding assembly 99 that may, for example, be representative of the grounding assemblies discussed with respect to FIGS. 1-4. The signal acquisition assembly 97 may, for example, include one or more electrical sensors that are configured to sense one or more electrical parameters pertaining to stray voltages within the rotating shaft 4. In some cases, the electric generator 91 may further include additional signal acquisition assemblies and/or shaft monitoring assemblies. In some cases, for example, a shaft monitoring assembly 101 is operably coupled with a shaft contact assembly 103 that may, for example, be in sliding contact with the rotating shaft 4 but not be in electrical contact with ground (i.e., electrically isolated from ground). The shaft monitoring assembly 101 may, for example, include one or more electrical sensors that are configured to sense one or more electrical parameters pertaining to stray voltages within the rotating shaft 4. A conduit 105 permits the signal acquisition assembly 97 to communicate with the shaft monitoring assembly 101 and in some cases allows the signal acquisition assembly 97 and/or the shaft monitoring assembly 101 to communicate with a remote control center, such as a remote control room or control board, for example. The remote control center may be on-site, or may be at a remote location and may, for example, be accessible via the Internet.

Figure 5A:
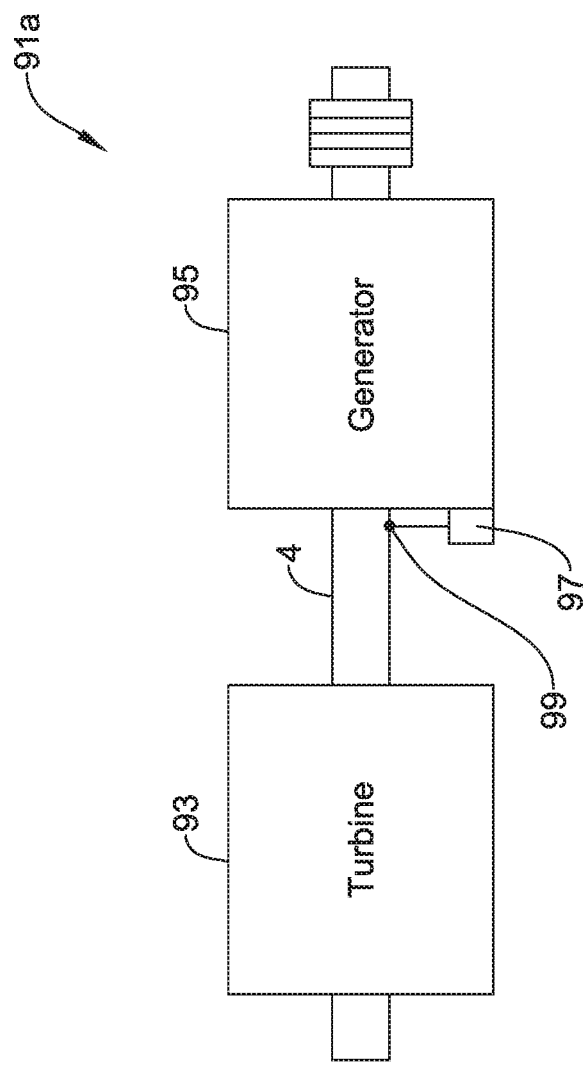
FIG. 5A is a schematic illustration of another electric generator incorporating a grounding monitoring system.

FIG. 5A is a schematic view of an electric generator 91*a* that may be considered as being representative of the electric machine 2. The electric generator 91*a* includes a turbine 93 and a generator 95. The rotating shaft 4 extends between the turbine 93 and the generator 95, and rotates therewith to transfer rotational energy between the turbine 93 and the generator 95. A signal acquisition assembly 97 is operably coupled with a shaft grounding assembly 99 that may, for example, be representative of the grounding assemblies discussed with respect to FIGS. 1-4. The signal acquisition assembly 97 may, for example, include one or more electrical sensors that are configured to sense one or more electrical parameters pertaining to stray voltages within the rotating shaft 4. In some cases, the electric generator 91 may further include additional signal acquisition assemblies and/or shaft monitoring assemblies, although this is not required in all cases.

Figure 5B:
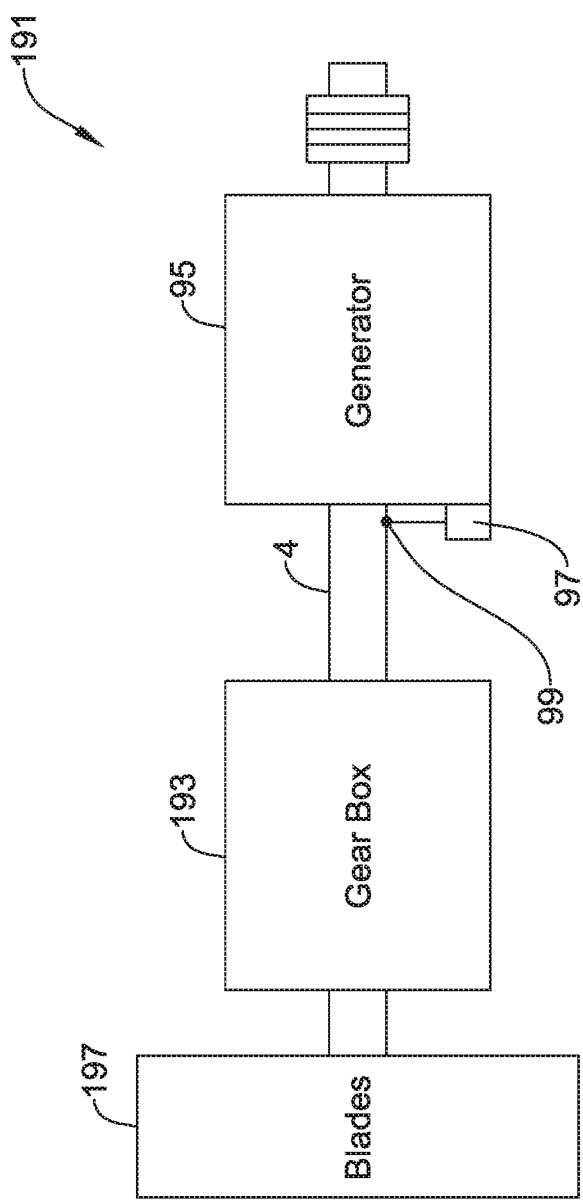
FIG. 5B is a schematic illustration of a wind powered machine incorporating a grounding monitoring system.

FIG. 5B is a schematic view of a wind driven electric generator 191 that may be considered as being representative of the electric machine 2. The electric generator 191 includes a gear box 193 and a generator 95. A blade assembly 197 engages the gear box 193 and drives the rotating shaft 4 that extends between the gear box 193 and the generator 95, and rotates therewith to transfer rotational energy between the blade assembly 197, the gear box 193 and the generator 95. A signal acquisition assembly 97 is operably coupled with a shaft grounding assembly 99 that may, for example, be representative of the grounding assemblies discussed with respect to FIGS. 1-4. The signal acquisition assembly 97 may, for example, include one or more electrical sensors that are configured to sense one or more electrical parameters pertaining to stray voltages within the rotating shaft 4. In some cases, the electric generator 91 may further include additional signal acquisition assemblies and/or shaft monitoring assemblies, although this is not required in all cases.

FIG. 6 is a schematic illustration of a monitoring system 81 in accordance with embodiments of the disclosure. In some cases, the monitoring system 81 may be included with the electric machine 2 (FIG. 1) and/or the electric generator 91 of FIG. 5, 5A or 5B. In some cases, the monitoring system 81 may be used with other devices that include a rotating shaft susceptible to stray voltages in the rotating shaft with or without a grounding apparatus. In some instances, the monitoring system 81 may be considered as being a stand-alone monitoring system or an add-on or retro-fit addition to the grounding apparatus described with respect to FIGS. 1-4. The monitoring system 81 includes a conductive member, such as the grounding member 40, that is configured to make sliding electrical contact with the rotating shaft 4 and that is configured to be connected to ground if used as a grounding member for the rotating shaft 4. An electrical sensor 85 is configured to be coupled with the grounding member 40 in order to detect an electrical parameter that provides an indication of electricity flowing from the rotating shaft 4 to ground through the grounding member 40. In some cases, the electrical sensor 85 is an electrical current sensor. In some cases, the electrical sensor 85 is an electrical voltage sensor.

A processor 82 is operably coupled with the electrical sensor 85 and is configured to receive and analyze data from the electrical sensor 85. A memory 88 is operably coupled with the processor 82 and is configured to store information processed by the processor 82 that is representative of data provided by the electrical sensor 85. In some cases, the memory 88 may represent short-term memory being used by the processor 82 for buffering incoming data from the electrical sensor 85. In some instances, the memory 88 may also be used for longer term storage of information that is representative of data provided by the electrical sensor 85.

In some instances, the electrical sensor 85 is configured to periodically provide the detected electrical parameter to the processor at a sampling rate that is related to a rotation speed of the rotating shaft. In some cases, the processor 82 may be configured to periodically sample a value of an electrical parameter provided by the electrical sensor 85. In some cases, the time period between successive samplings of a value of an electrical parameter provided by the electrical sensor 85 may be selected such that an angular shaft position of the rotating shaft 4 corresponding to a particular sampling point is offset from an angular shaft position of the rotating shaft 4 corresponding to a subsequent sampling point. In other words, each successive sampling of the electrical parameter may be taken at a position or sampling point around the rotating shaft 4 which is angularly offset from the previous sampling position or sampling point. The sampling points may, for example, be timed such that the processor 82 receives or processes one or more distinct sampling points per rotation of the rotating shaft 4. In some cases the sampling points may be timed such that the processor 82 receives or processes one distinct sampling point per one, two or more rotations of the rotating shaft 4. In some instances, a series of sampling points may be timed such that each sampling point corresponds to a different point on a subsequent waveform, whether a subsequent waveform corresponds to the next rotation of the rotating shaft 4, or the subsequent waveform corresponds to a later rotation of the rotating shaft 4.

As an example, in some cases, the sampling rate at which the electrical parameter from the electrical sensor 85 is sampled may be related to the rotation speed of the rotating shaft 4 such that a particular sampling corresponds to an angular position of the rotating shaft 4 that is rotationally advanced (e.g., angularly offset) of the angular position of the rotating shaft 4 corresponding to an immediately previous sampling. In some cases, the sampling rate at which the electrical parameter from the electrical sensor 85 is sampled may be related to the rotation speed of the rotating shaft 4 such that a particular sampling corresponds to an angular position of the rotating shaft 4 that is rotationally retarded (e.g., angularly offset) of the angular position of the rotating shaft 4 corresponding to an immediately previous sampling.

In some cases, when sampling the electrical parameter provided by the electrical sensor 85, the processor 82 may be configured to sample the value of the electrical parameter from the electrical sensor 85 and record the value to the memory 88 in response to a periodic trigger. The periodic trigger may, for example, be based upon a rotational speed of the rotating shaft 4. In some cases, the periodic trigger may be based upon a rotational (angular) position of the rotating shaft 4. In some cases, the periodic trigger may include an incremental delay so that each successive sampling of an instantaneous value of the electrical parameter from the electrical sensor 85 corresponds to a different portion of a successive waveform. In some cases, the value of the electrical parameter from the electrical sensor 85 may be an amplitude of a waveform representing the electrical parameter from the electrical sensor 85.

In some cases, the processor 82 may be further configured to correlate the reconstructed waveform to relative positions of the rotating shaft in order to determine where on the rotating shaft any anomalous or threshold conditions may be occurring. If any anomalous or threshold conditions are occurring, it can be beneficial to know where on the rotating shaft 4 a possible problem is developing. In some cases, for example, the processor 82 may be further configured to utilize an indication of shaft rotational speed, in combination with knowing how frequently a sample is being taken, in order to correlate the reconstructed waveform to relative positions of the rotating shaft 4. As another example, in some cases the processor 82 is further configured to, when periodically sampling a value of the electrical parameter from the electrical sensor 85 and recording the value to the memory 88, to also record to the memory 88 a corresponding shaft rotational position that is temporally aligned with the value of the electrical parameter from the electrical sensor 85. The processor 82 may then use the temporally aligned recorded shaft rotational positions to correlate the reconstructed waveform to relative positions of the rotating shaft 4.

Figure 7:
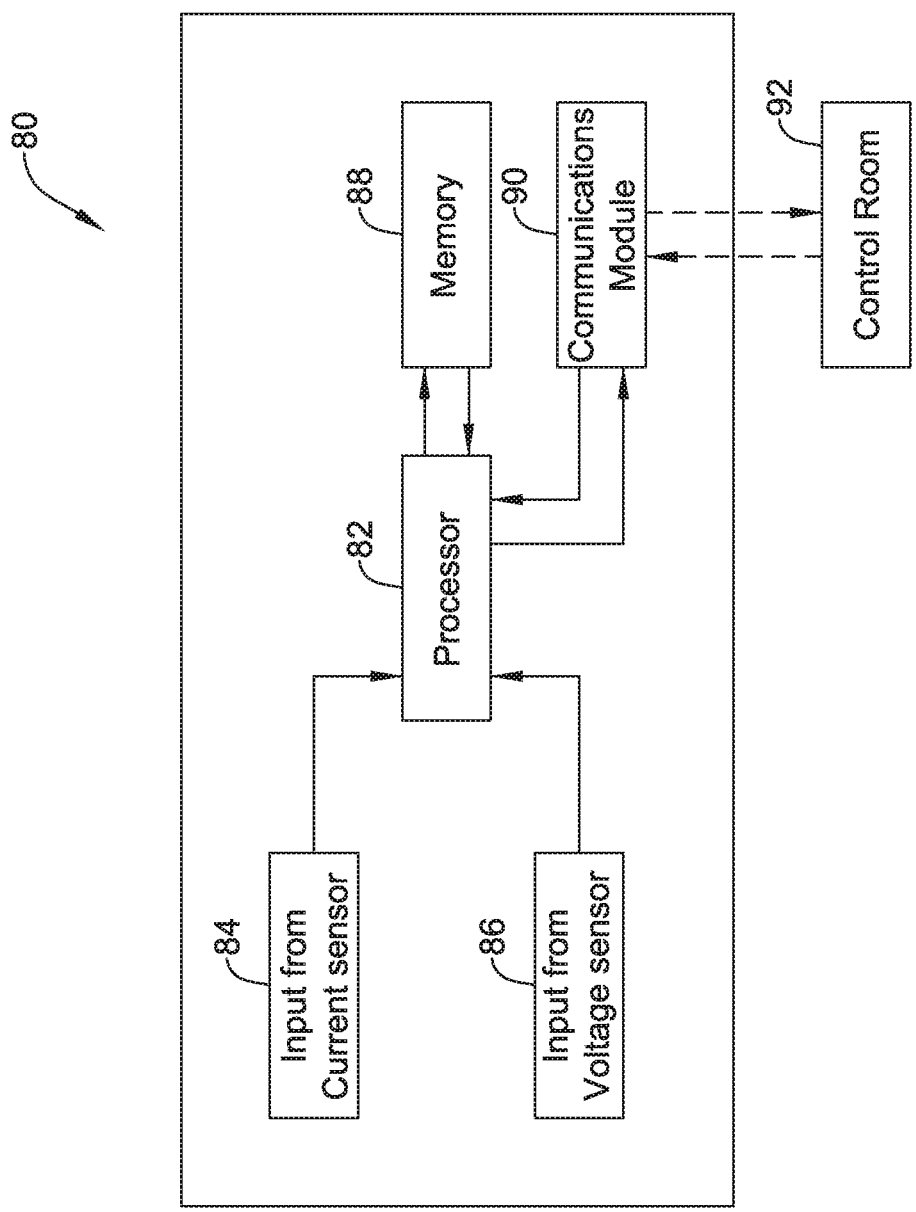
FIG. 7 is a schematic view of a monitoring system for a rotating shaft.

FIG. 7 is a schematic illustration of a monitoring system 80 in accordance with embodiments of the disclosure. In some cases, the monitoring system 80 may be built into the electric machine 2 (FIG. 1). In some cases, the monitoring system 80 may be used with other devices that include a rotating shaft susceptible to stray voltages in the rotating shaft with or without a grounding system. In some instances, the monitoring system 80 may be considered as being a stand-alone monitoring system or an add-on or retro-fit addition to the grounding apparatus described with respect to FIGS. 1-4. The monitoring system 80 includes the processor 82 that may be configured to receive data from a current sensor and thus may be operably coupled with an INPUT FROM CURRENT SENSOR 84. In some cases, the processor 82 may be configured to receive data from a voltage sensor and thus may be operably coupled with an INPUT FROM VOLTAGE SENSOR 86.

As used herein, continuous sampling is sampling that occurs at a repeated interval and provides a sequential sequence of samples. For example, as opposed to an analog signal, which is truly continuous, a digital signal may be considered as meeting the definition provided herein of continuous sampling as referring to sampling that occurs at a repeated interval as a function of the sampling frequency. Thus, continuous sampling may refer to repeated sampling at a known interval.

It will be appreciated that the INPUT FROM CURRENT SENSOR 84 and/or the INPUT FROM VOLTAGE SENSOR 86 may each independently represent a data channel providing data to the processor 82. The memory 88 may be operably coupled with the processor 82 and may, for example, be used to store, e.g., buffer, data provided directly from the INPUT FROM CURRENT SENSOR 84 and/or the INPUT FROM VOLTAGE SENSOR 86. In some cases, the memory 88 may also store data that has been processed by the processor 82 and thus may, for example, be representative of data that was provided from the INPUT FROM CURRENT SENSOR 84 and/or the INPUT FROM VOLTAGE SENSOR 86. A communications module 90 may be operably coupled to the processor 82 in order to communicate data to a location remote from the electric machine 2, such as a control room 92. In some cases, the communications module 90 may be used for receiving instructions and other data from the control room 92. It will be appreciated that the control room 92 may, for example, refer to an on-site control room that is proximate the location of the electric machine 2. In some cases, the control room 92 may refer instead to a remote facility, a cloud-based data collection system, a cloud-based monitoring system, and the like.

Figure 8:
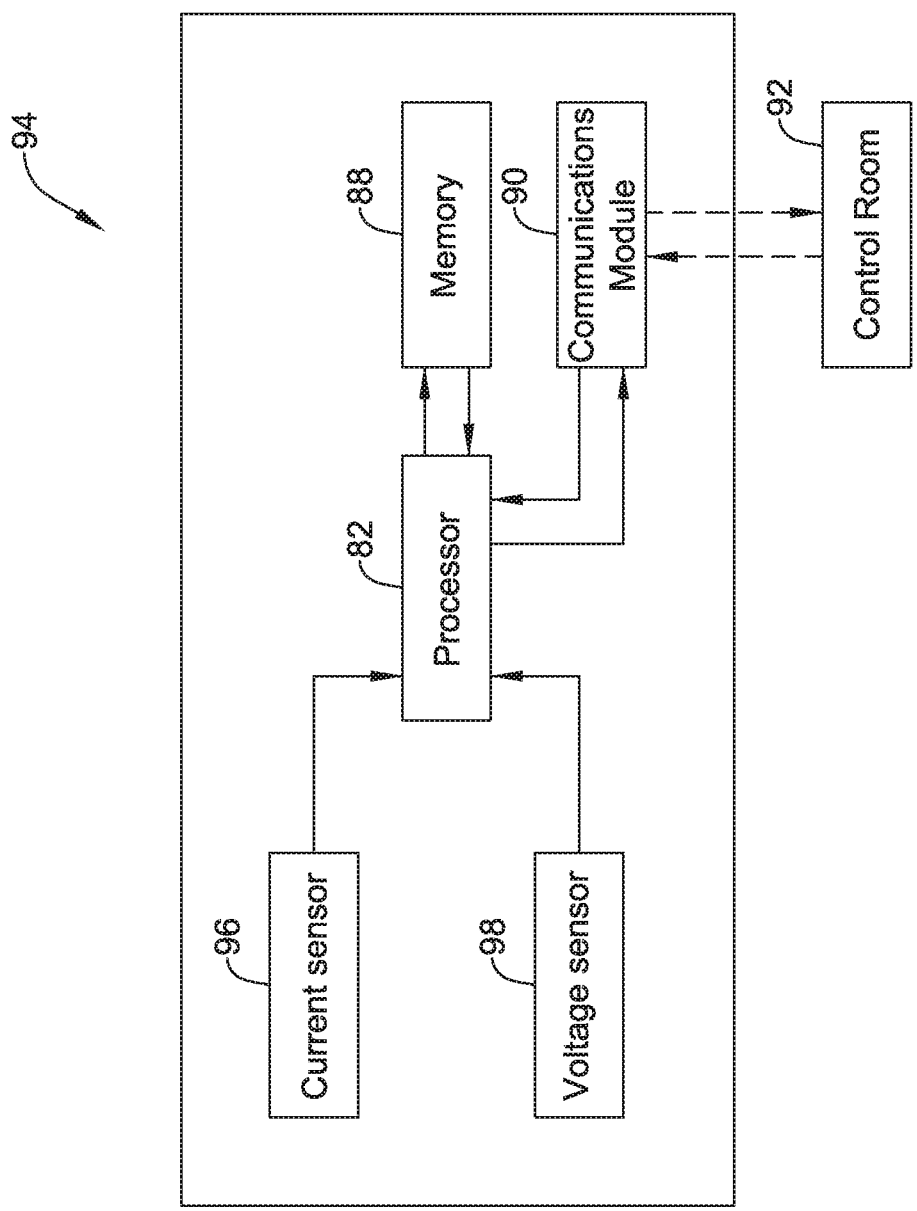
FIG. 8 is a schematic view of a monitoring system for a rotating shaft.

FIG. 8 is a schematic illustration of a monitoring system 94 in accordance with embodiments of the disclosure. In some cases, the monitoring system 94 may be included with the electric machine 2 (FIG. 1). In some cases, the monitoring system 94 may be used with other devices that include a rotating shaft susceptible to stray voltages in the rotating shaft with or without a grounding apparatus. In some instances, the monitoring system 94 may be considered as being a stand-alone monitoring system or an add-on or retro-fit addition to the grounding apparatus described with respect to FIGS. 1-4. The monitoring system 94 includes the processor 82 and the memory 88 that is operably coupled with the processor 82, much as described with respect to the monitoring system 80 illustrated in FIG. 7. The monitoring system 94 includes one or more sensors for sensing one or more electrical parameters, such as an electrical current sensor 96 and an electrical voltage sensor 98, each of which are operably coupled with the processor 82 such that the processor 82 may receive data from each of the current sensor 96 and the voltage sensor 98. The communications module 90 permits communication between the monitoring system 94 and the control room 92. The current sensor 96 may be any sensor that is configured to sense an electrical current. In some cases, the current sensor 96 may be a Hall effect sensor, but this is not required in all cases. The voltage sensor 98 may be any sensor that is configured to detect an electrical voltage.

In other instances, the monitoring system 94 may include only one of the current sensor 96 and the voltage sensor 98, and be configured to calculate an electrical voltage based on a sensed electrical current from the current sensor 96 or calculate an electrical current based on a sensed electrical voltage from the voltage sensor 98. For example, an electrical shunt having a 1 Ohm resistor may be used such that electrical current equals electrical voltage, although others can be used as well, such as a shunt having a 10 Ohm resistor, a 100 Ohm resistor, a 1000 Ohm resistor, and the like.

Figure 9:
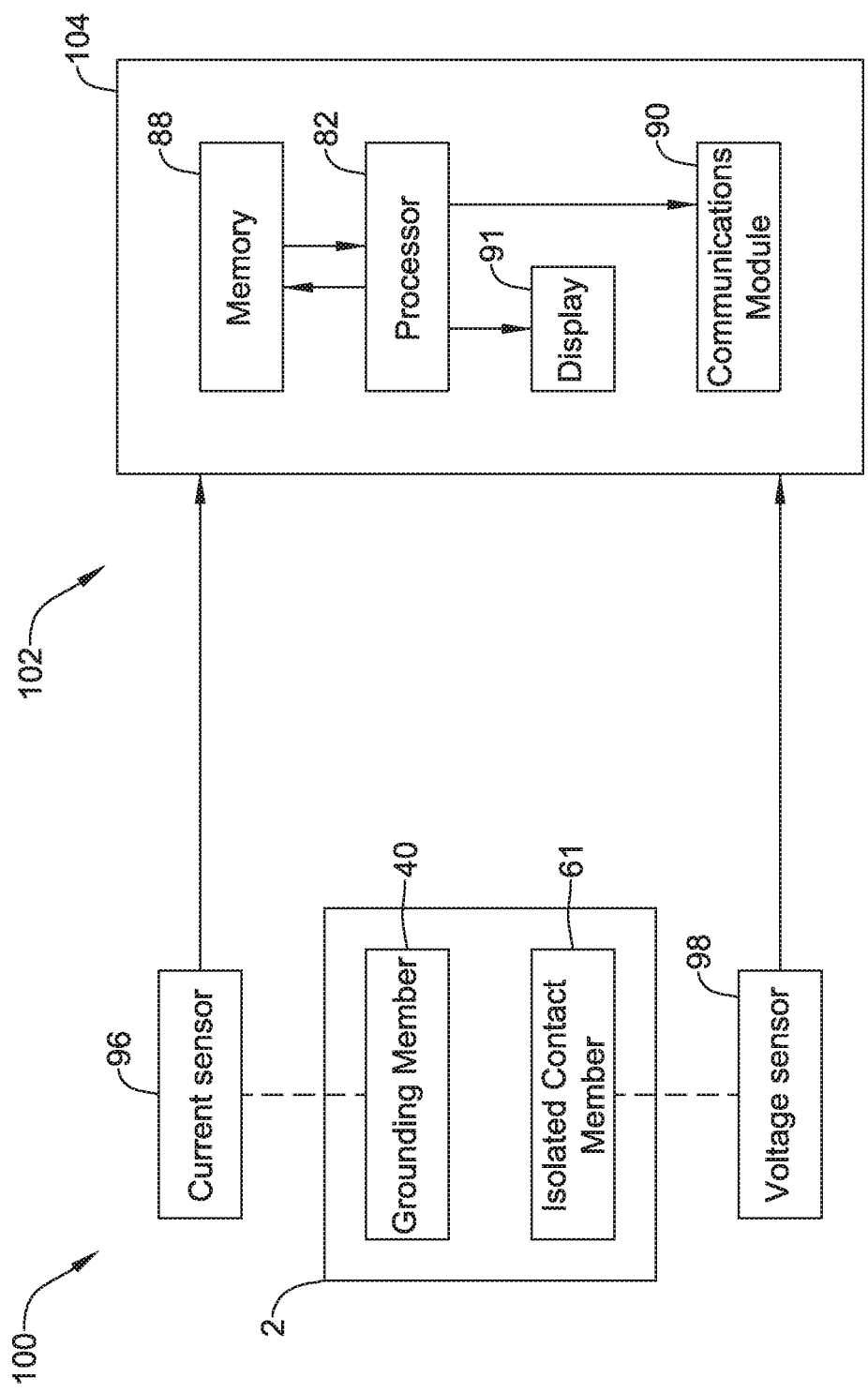
FIG. 9 is a schematic view of a shaft grounding and monitoring system for a rotating shaft.

FIG. 9 is a schematic illustration of an assembly 100 that includes the electric machine 2 (FIG. 1) in combination with a monitoring system 102. The monitoring system 102 includes the current sensor 96 disposed proximate or otherwise relative to the conductive grounding member 40 in such a way as to enable the current sensor 96 to sense or detect a current flowing in the grounding member 40. The monitoring system 102 also includes the voltage sensor 98 disposed proximate or otherwise relative to an isolated contact member 61 in such a way as to enable the voltage sensor 98 to sense or detect a voltage within the rotating shaft 4 (FIG. 1). In some instances, the isolated contact member 61 may be a second grounding rope 40 that is electrically isolated from ground. In some cases, the isolated contact member 61 may include an electrical shunt that is connected with the grounded grounding rope 40. In some cases, a shunt may be used to determine current and/or voltage. It will be appreciated that since there is a well-known relationship between current and voltage, an appropriately sized shunt may permit determination of current and voltage. In some cases, the voltage sensor 98 may be a single voltage sensor or may be a pair (or more) of distinct voltage sensors, and may be configured to sense or detect a voltage within the rotating shaft 4 at two different locations on the rotating shaft 4, such as but not limited to a turbine end and an exciter end of the rotating shaft 4.

The monitoring system 102 may, for example, include a processing module 104 that houses the processor 82, the memory 88 and the communications module 90 as discussed with respect to FIGS. 7 and 8. It is contemplated that in some cases, the processing module 104 may include a display 91 that is operably coupled to the processor 82 such that sensed electrical voltages and/or current data, errors and/or warnings pertaining to potential anomalous or threshold conditions may be visibly displayed, for example. The display 91 may be used to display the reconstructed waveform, for example.

In some instances, a potential anomalous or threshold condition may be a current spike that lasts longer than a particular length of time, or perhaps a current spike that reaches a current level that exceeds a threshold current value. These thresholds may be programmed into the processor 82, or may be manually entered into the monitoring system 102. In some cases, a potential anomalous or threshold condition may not be related to a current spike, but may instead pertain to an instruction received from the control room 92 (FIG. 6), requesting additional information from the monitoring system 102.

In some cases, the processor 82 may calculate one or more values that are representative of the sampled data points, and may save the one or more representative values to the memory 88. Any variety of representative values may be calculated and saved. For example, the processor 82 may calculate an average current value and/or a peak current value. In some cases, the processor 82 may also conduct waveform analysis of the reconstructed waveform in order to look for particular patterns that indicate particular issues. For example, a saw tooth waveform with a slow rise and subsequent rapid discharge can indicate the build-up and release of static electricity on the rotating shaft 4.

Figure 10:
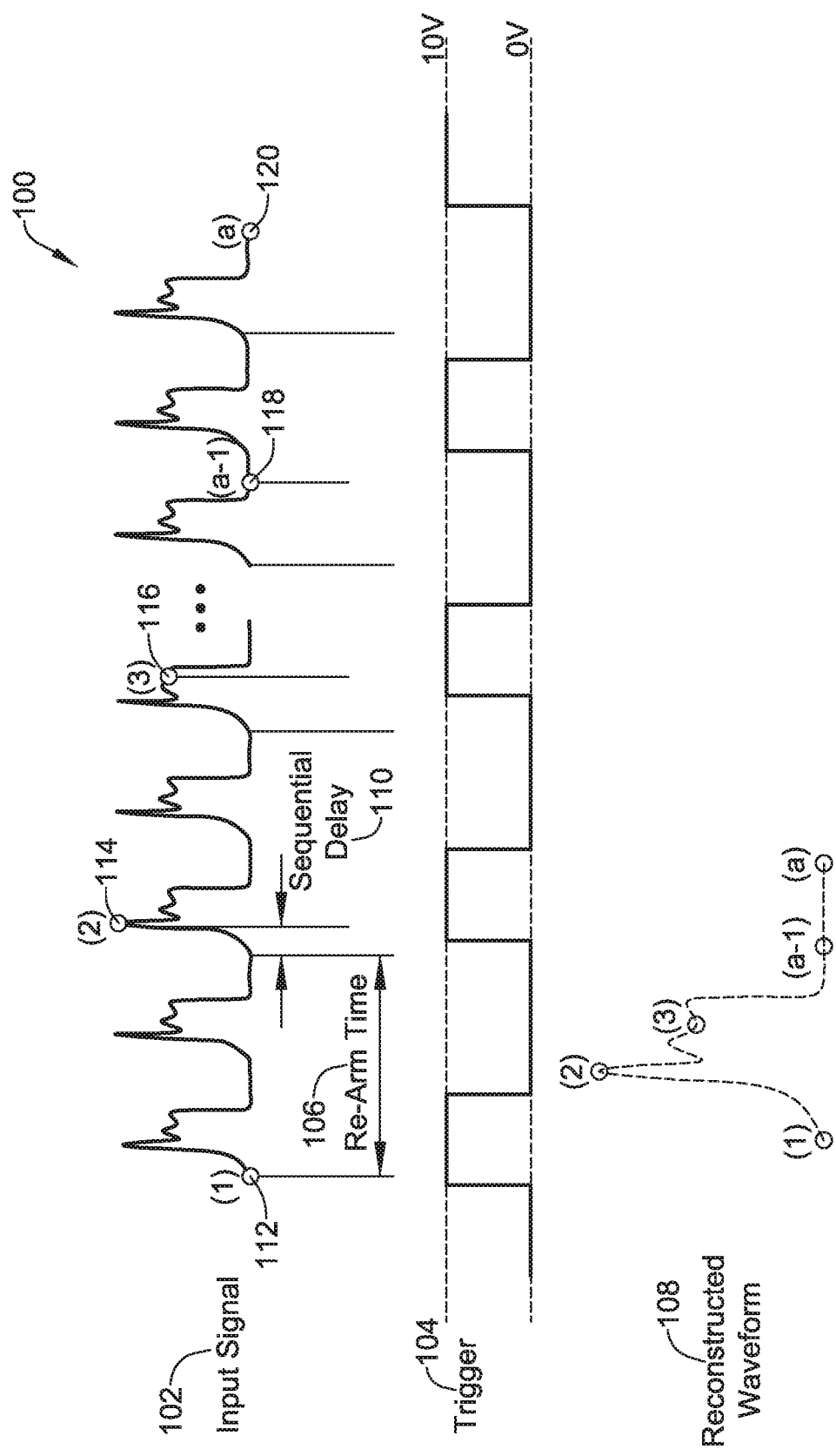
FIG. 10 is a graphical representation of waveform acquisition using equivalent time sampling.

FIG. 10 is a graphical illustration 100 of how a repeating waveform can be continuously sampled at a relatively slow sampling rate in order to reconstruct a waveform from a plurality of individual data points, without a need for sampling at a higher sampling rate. FIG. 10 includes a graphical representation of an input signal 102. The input signal 102 represents the actual data being sampled and includes a repeated waveform, corresponding to subsequent rotations of the rotating shaft 4. A periodic trigger signal 104 defines sampling points. In some cases, the periodic trigger signal 104 may include a signal that is either at 0 volts or at 10 volts, although this is merely illustrative. In some cases, there may be a re-arm time 106 that limits how frequently data may be sampled. In some cases, this may be a hardware limitation. In other cases, this may be software-controlled, and may be based at least in part upon the rotating speed of the rotating shaft 4, and may be based at least in part upon a desired accuracy or how close together the data points creating a reconstructed waveform 108 are desired to be. The re-arm time may be greater than one revolution of the rotating shaft 4, and thus greater than one cycle of the waveform, in some instances. In some cases, a sequential delay 110 may be used to delay sampling at each successive data sampling point.

In operation, a sampling point 112, labeled as "1", is made in response to the trigger signal 104. When the next trigger signal 104 occurs, the sequential delay 110 is added before the next sampling point 114, labeled as "2" is made. This continues with a sampling point 116, labeled as "3" is made, then a sampling point 118, labeled as "a−1", followed by a sampling point 120, labeled as "a". The sensed parameter (electrical current or voltage) may be sampled at each sampling point 112, 114, 116, 118, 120 through less than one revolution of the rotating shaft 4, such as through 10 degrees of rotation or less, 5 degrees of rotation or less, 4 degrees of rotation or less, 3 degrees of rotation or less, 2 degrees of rotation or less, or 1 degree of rotation or less of the rotating shaft 4. It will be appreciated by looking at the relative locations of the sampling points 112, 114, 116, 118 and 120, that each sampling point is at a different location on the waveform represented by the input signal 102, corresponding to a different rotational position around the rotating shaft 4. This can also be seen in the reconstructed waveform 108, in the relative spacing of the sample points "1", "2", "3", . . . "a-1" and "a". Thus, the reconstructed waveform 108 may be a compilation of sequential sample points at different rotational positions of the rotating shaft 4 taken during multiple revolutions of the rotating shaft 4, that when compiled together form the reconstructed waveform 108 representative of the sensed parameter (electrical current or voltage) throughout a single revolution of the rotating shaft 4. As can be seen, the reconstructed waveform 108 provides a reasonable approximation to the original input signal 102. Due to the repetitive nature of the input signal from the rotating shaft 4, the reconstructed waveform 108 may be representative of the sensed parameter (electrical current or voltage) throughout a single revolution of the rotating shaft 4. A finer approximation may be obtained, for example, by reducing the sequential delay 110. It is feasible, therefore, to obtain a reasonable approximation of the original waveform while reducing data sampling requirements.

In some cases, as illustrated, it can be seen that the periodic trigger signal 104 is timed such that a sampling point occurs once every other shaft revolution. In some cases, the periodic trigger signal 104 may instead be timed such that a sampling point occurs once each shaft revolution. If desired, the periodic trigger signal 104 may be timed to permit multiple sampling points per each shaft revolution. In other instances, the periodic trigger signal 104 may be timed such that a sampling point occurs every third, fourth, fifth, or sixth revolution, or less frequently, if desired. In some cases, the timing of the periodic trigger signal 104 may be a function of how rapidly the shaft is rotating (i.e., a function of the rotational speed of the shaft), or perhaps how predictable or unpredictable the waveform that is being sampled actually is. In some cases, it is contemplated that the timing of the periodic trigger signal 104 may be adjusted in real time or in near-real time to accommodate changes in performance. For example, if the waveform appears to be changing, the timing of the periodic trigger signal 104 may be adjusted to permit more frequent sampling.

Those skilled in the art will recognize that the present invention may be manifested in a variety of forms other than the specific embodiments described and contemplated herein. Accordingly, departure in form and detail may be made without departing from the scope and spirit of the present invention as described in the appended claims.

What is claimed is:

1. A shaft grounding and monitoring system for a device having a rotating shaft, the shaft grounding and monitoring system comprising:
    a grounding member configured to make sliding electrical contact with the rotating shaft, the grounding member configured to be connected to ground;
    an electrical sensor configured to sense an electrical parameter that provides an indication of electricity flowing through the grounding member,
    a processor operably coupled with the electrical sensor, the processor configured to receive and analyze data from the electrical sensor representing the electrical parameter;
    a memory operably coupled with the processor and configured to store data processed by the processor that is representative of the data provided by the electrical sensor;
    the processor further configured to periodically sample a value of the electrical parameter from the electrical sensor and record each value to the memory; and
    the processor further configured to develop, over time, a reconstructed waveform representing a compilation of the periodically sampled values recorded to the memory.

2. The shaft grounding and monitoring system of claim 1, wherein the processor is further configured to sample the value of the electrical parameter from the electrical sensor and record the value to the memory in response to a periodic trigger.

3. The shaft grounding and monitoring system of claim 2, wherein the periodic trigger is based upon a rotational speed of the rotating shaft.

4. The shaft grounding and monitoring system of claim 2, wherein the periodic trigger is based upon a rotational position of the rotating shaft.

5. The shaft grounding and monitoring system of claim 2, wherein the periodic trigger includes an incremental delay so that each successive sampling of an instantaneous value of the electrical parameter from the electrical sensor comprises a different portion of a successive waveform.

6. The shaft grounding and monitoring system of claim 1, wherein the value of the electrical parameter from the electrical sensor comprises an amplitude of a waveform representing the electrical parameter from the electrical sensor.

7. The shaft grounding and monitoring system of claim 1, wherein the electrical sensor comprises an electrical current sensor or an electrical voltage sensor.

8. The shaft grounding and monitoring system of claim 1, wherein the processor is further configured to correlate the reconstructed waveform to relative positions of the rotating shaft in order to determine where on the rotating shaft any anomalous or threshold conditions may be occurring.

9. The shaft grounding and monitoring system of claim 8, wherein the processor is further configured to utilize an indication of shaft rotational speed and a known sampling rate to correlate the reconstructed waveform to relative positions of the rotating shaft.

10. The shaft grounding and monitoring system of claim 8, wherein the processor is further configured to, when periodically sampling a value of the electrical parameter from the electrical sensor and recording the value to the memory, to also record to the memory a corresponding shaft rotational position that is temporally aligned with the value of the electrical parameter from the electrical sensor; and
    the processor is further configured to use the temporally aligned recorded shaft rotational positions to correlate the reconstructed waveform to relative positions of the rotating shaft.

11. The shaft grounding and monitoring system of claim 1, wherein the processor is further configured to analyze the reconstructed waveform to look for anomalous or threshold conditions that may be occurring.

12. A monitoring system for a device having a rotating shaft and a grounding member positioned in electrical contact with the rotating shaft, the monitoring system comprising:
    a voltage sensor configured to sense an electrical voltage in the rotating shaft;
    a processor operably coupled with the voltage sensor, the processor configured to receive and analyze data indicative of electrical voltage sensed by the voltage sensor;
    a memory operably coupled with the processor and configured to store data processed by the processor that is indicative of the data provided by the voltage sensor;

the processor further configured to periodically sample a value of the data indicative of electrical voltage from the voltage sensor and record each value to the memory; and the processor further configured to develop, over time, a reconstructed waveform representing a compilation of the periodically sampled values recorded to the memory.

13. The monitoring system of claim 12, wherein the processor is further configured to sample the value of the data indicative of electrical voltage from the voltage sensor and record the value to the memory in response to a periodic trigger.

14. The monitoring system of claim 13, wherein the periodic trigger is based upon a rotational speed and/or angular position of the rotating shaft.

15. The monitoring system of claim 13, wherein the periodic trigger includes an incremental delay so that each successive sampling of a value of the data indicative of electrical voltage from the voltage sensor comprises a different portion of a successive waveform.

16. The monitoring system of claim 12, wherein the value of the data indicative of electrical voltage from the voltage sensor comprises an amplitude of a waveform representing data indicative of electrical voltage from the voltage sensor.

17. The monitoring system of claim 12, wherein the processor is further configured to analyze the reconstructed waveform to look for anomalous or threshold conditions that may be occurring.

18. A monitoring system for a device having a rotating shaft and a grounding member positioned in electrical contact with the rotating shaft, the monitoring system comprising:

an electrical sensor configured to sense an electrical parameter in the rotating shaft;

a processor operably coupled with the electrical sensor, the processor configured to receive and analyze data indicative of the electrical parameter sensed by the electrical sensor;

a memory operably coupled with the processor and configured to store data processed by the processor that is indicative of the data provided by the electrical sensor;

the processor further configured to periodically sample a value of the data indicative of the electrical parameter from the electrical sensor at a sampling rate that is related to a rotation speed of the rotating shaft such that a particular sampling corresponds to an angular position of the rotating shaft that is rotationally offset from the angular position of the rotating shaft corresponding to an immediately previous sampling, the processor recording each value to the memory; and the processor further configured to develop, over time, a reconstructed waveform representing a compilation of the periodically sampled values of the data indicative of electrical voltage from the electrical sensor.

19. The monitoring system of claim 18, wherein the sampling rate is related to the rotation speed of the rotating shaft such that a particular sampling corresponds to an angular position of the rotating shaft that is rotationally advanced of the angular position of the rotating shaft corresponding to an immediately previous sampling.

20. The monitoring system of claim 18, wherein the sampling rate is related to the rotation speed of the rotating shaft such that a particular sampling corresponds to an angular position of the rotating shaft that is rotationally retarded of the angular position of the rotating shaft corresponding to an immediately previous sampling.

21. The monitoring system of claim 18, wherein the electrical sensor comprises a voltage sensor.

22. The monitoring system of claim 21, wherein the value of the data indicative of the electrical parameter comprises an amplitude of a waveform representing data indicative of electrical voltage from the voltage sensor.

23. The monitoring system of claim 18, wherein the processor is further configured to analyze the reconstructed waveform to look for anomalous or threshold conditions that may be occurring.

* * * * *